US006670838B1

(12) United States Patent
Cao (10) Patent No.: US 6,670,838 B1
(45) Date of Patent: Dec. 30, 2003

(54) DIGITAL CLOCK ADAPTIVE DUTY CYCLE CIRCUIT

(75) Inventor: Wangpeng Cao, San Jose, CA (US)

(73) Assignee: Chrontel, Inc., San Jose, CA (US)

( * ) Notice: Subject to any disclaimer, the term of this patent is extended or adjusted under 35 U.S.C. 154(b) by 0 days.

(21) Appl. No.: 10/288,786

(22) Filed: Nov. 5, 2002

(51) Int. Cl.[7] ............................................... H03K 3/017
(52) U.S. Cl. ....................................................... 327/175
(58) Field of Search ................................ 327/172, 175, 327/176, 155, 156, 101–103, 551, 72–73, 87, 89

(56) References Cited

U.S. PATENT DOCUMENTS

| | | | |
|---|---|---|---|
| 6,320,438 B1 | * 11/2001 | Arcus ........................... | 327/175 |
| 6,323,706 B1 | * 11/2001 | Stark et al. ................... | 327/175 |
| 6,424,178 B1 | * 7/2002 | Harrison ....................... | 326/93 |
| 6,456,133 B1 | * 9/2002 | Nair et al. ..................... | 327/175 |

* cited by examiner

Primary Examiner—My-Trang Nu Ton
(74) Attorney, Agent, or Firm—Dorsey & Whitney LLP (57) ABSTRACT

A nominal 50% duty cycle input CLKIN clock signal is processed by an adaptive circuit that outputs complementary CLK and CLKB clock signals whose duty cycle is continuously and automatically maintained at substantially 50%. The circuit includes a duty cycle adjustor circuit comprising inverter stages whose $V_{TH}$ is adjusted by a control voltage $V_C$ to vary duty cycle of the CLKIN signal passing through the stages. The inverter output signal is converted to the differential CLK, CLKB signals, which are low pass filtered to obtain DC voltages that are input to a differential operational amplifier whose output is control signal $V_C$. Using the ensured substantially 50% duty cycle for CLK (or CLKB) enables data to be clocked or latch-transferred between IC stages substantially error free even if IC stage setup time varies, and clock frequency is increased. CLK duty cycle can be held to 50%±0.1% even if CLKIN duty cycle varies from 33% to 67%.

20 Claims, 8 Drawing Sheets

DIGITAL CLOCK ADAPTIVE DUTY CYCLE CIRCUIT

FIELD OF THE INVENTION

The invention relates generally to digital circuits that clock transmit data, and more specifically to providing a circuit that dynamically adjusts the waveform of an input digital clock whose nominal duty cycle may not be 50% and to output a digital close having a substantially 50% duty cycle such that transmission data errors are reduced.

BACKGROUND OF THE INVENTION

Figure 1:
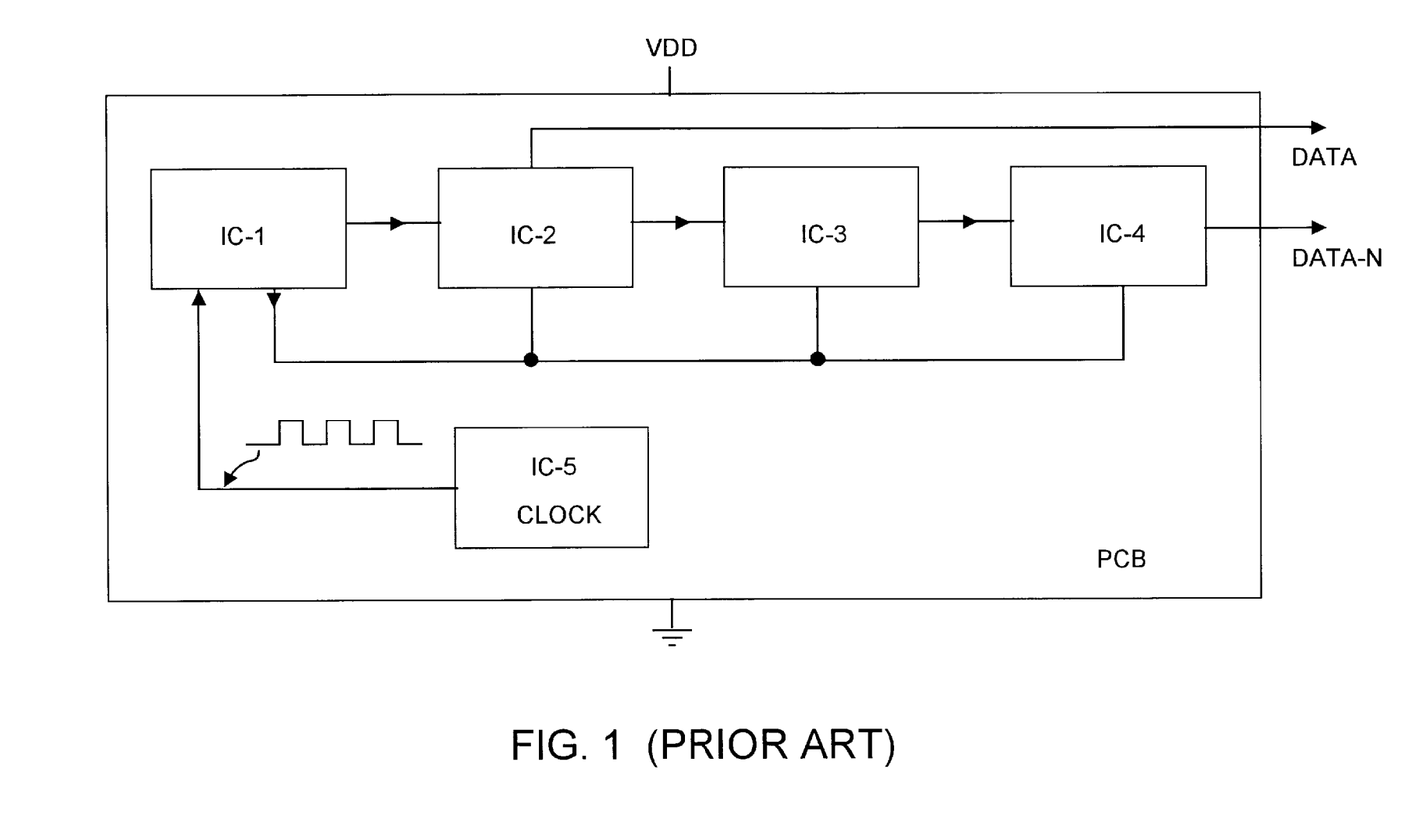
FIG. 1 depicts a generic printed circuit board and clocked integrated circuits, according to the prior art.

In the field of digital communication, it is common to provide a printed circuit board (PCB) whereon several integrated circuits (ICs) are mounted. FIG. 1 shows a generic PCB containing several ICs, IC-1, IC-2, IC-3, and a clock circuit (CLOCK), which itself may be an IC. FIG. 1 depicts the various ICs coupled to receive an operating potential VDD. In many applications, it is desired that the clock frequency be as fast as possible such that DATA can be output quickly. As such, there is a need for ever faster clock frequencies and data rates.

Figure 2A:
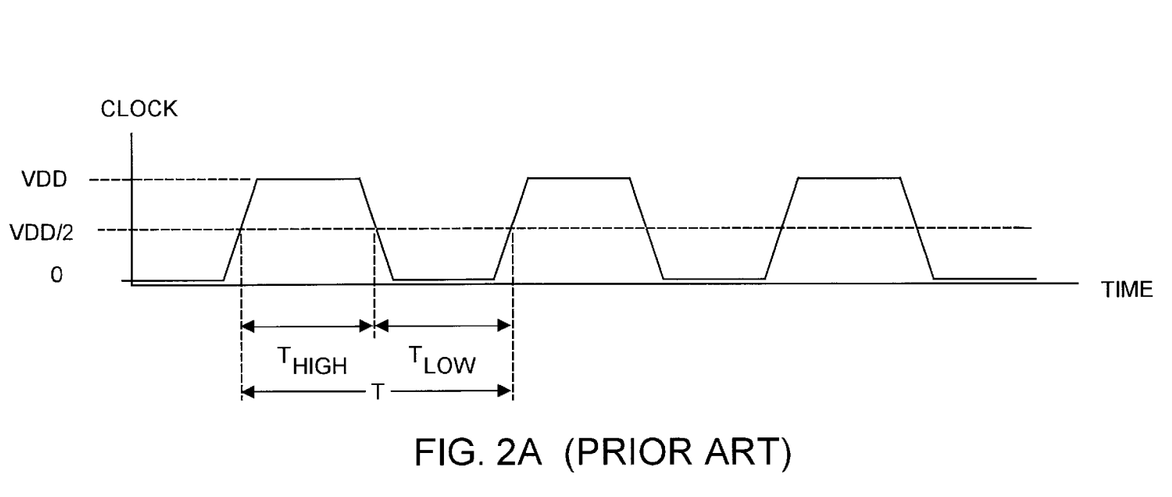
FIG. 2A depicts and defines regions of a clock signal, according to the prior art.

FIG. 2A depicts an exemplary waveform for the clock signal (CLOCK) as a function of time. In this example, the logical low voltage magnitude of the clock signal is 0 VDC and the logical high voltage magnitude of the clock is VDD. In FIG. 2A, time $T_{HIGH}$ denotes the useful high state portion of the clock signal, and $T_{LOW}$ denotes the useful low state portion of the clock signal. The period of the clock signal is defined as $T=T_{HIGH}+T_{LOW}=1/f$, where f is the frequency in Hz of the clock signal. The duty cycle (D) of the clock waveform can be defined as $D=T_{HIGH}/T$ or alternatively as $D=D_{LOW}/T$. The 0-to-1 state portion of the clock waveform defines the rising edge of the clock, and the 1 to-0 state portion of the clock waveform defines the falling edge. In most digital circuits, ICs change state and data is transmitted at the VDD/2 threshold of the rising or falling edge of the clock waveform transitions. As such, increased clock frequency (f) and data transmission between IC's dictates that the frequency and duty cycle characteristics of the digital signals be more precisely controlled.

Figure 2B:
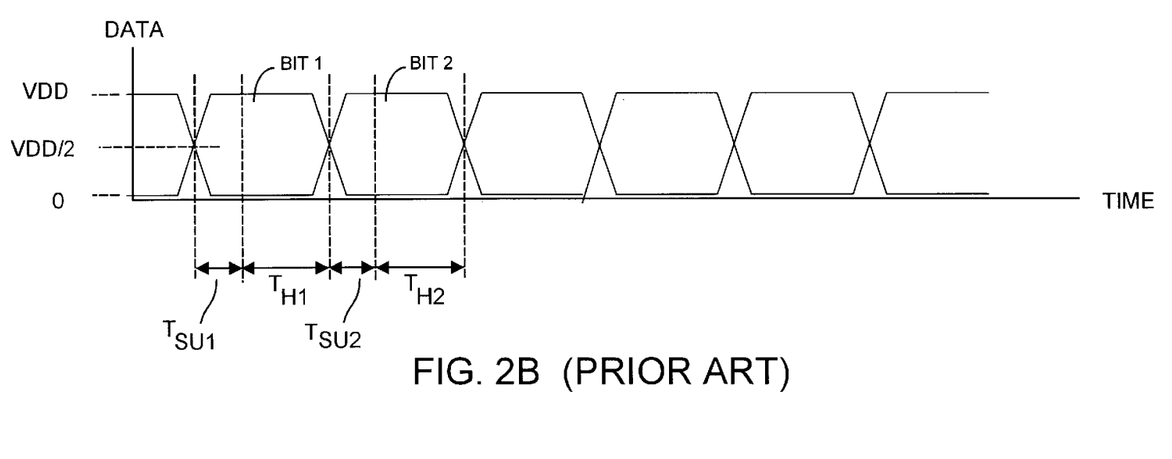
FIG. 2B depicts and defines regions of a data signal, according to the prior art.

FIG. 2B depicts an exemplary data signal (DATA), for example an output signal from IC2 in FIG. 1. IC1 may be considered a transmitter IC that provides a CLOCK signal and a DATA signal to IC2, which may be considered as a receiver IC. Within IC2, the rising and falling edges of the CLOCK signal from IC1 may be used to "latch" DATA from IC1 into IC2. The time required for the DATA to arrive at IC2 before the CLOCK signal is present is commonly referred to as the setup time ($T_{SU}$). Importantly, if DATA should arrive at IC2 too early, at a time less than a certain minimum time $T_{SUM}$, the DATA can be lost, or latched in incorrectly. The amount of time for the DATA to be held after the CLOCK rising edge is commonly referred to as the hold time ($T_h$). If DATA is removed too soon, e.g., less than a certain time $T_{HM}$, then again DATA can be lost or latched into IC2 in error. Thus, $T_{SUM}$ and $T_{HM}$ represent the minimum setup time and hold time for error free data transmission.

Thus there is a need for a mechanism and method to achieve substantially error free data transmission in a digital circuit that clocks transmit data. Preferably such mechanism and method should ensure that the minimum setup and hold timing requirements are always met, even when the input clock duty cycle is not precisely 50%.

The present invention provides such a mechanism and method.

SUMMARY OF THE PRESENT INVENTION

A digital clock adaptive duty cycle circuit receives an input clock CLKIN having duty cycle of close to 50%, and outputs a CLK signal (and its complement CLKB) whose duty cycle may be continuously and automatically varied to ensure that output duty cycle is 50%, precise to within about ±0.1%. The overall circuit includes a duty cycle adjustor (DCA) unit that includes preferably an odd number of inverter stages. Preferably at least two of the inverter stages include devices, e.g., MOS transistors, that have a parameter (e.g., threshold voltage $V_{TH}$) that can be varied as a function of a control voltage $V_C$ to affect the duty cycle of the inverter signal output by the inverter. The effect of $V_{TH}$ variation within each inverter stage is to vary the duty cycle of the clock signal output from the inverter stage, and thus from the DCA unit itself. The DCA output signal preferably is converted from a single-ended to a differential signal pair, CLK and its complement CLKB. The differential signal pair is low pass filtered and input differentially to an operational amplifier. The output of the operation amplifier is fedback to the DCA unit as control voltage $V_C$.

The ability to receive an input clock whose duty cycle may not be exactly 50%, and to dynamically ensure an output CLK signal with a precise 50% duty cycle enables data to be clocked or latch-transferred from IC stage to IC stage substantially error free, even if IC stage setup time varies. The ability to ensure substantially error free data transfer is maintained, even as clock frequency is increased.

Other features and advantages of the invention will appear from the following description in which the preferred embodiments have been set forth in detail, in conjunction with their accompanying drawings.

DETAILED DESCRIPTION OF THE PREFERRED EMBODIMENTS

As noted with respect to FIGS. 1, 2A, and 2B, to achieve substantially error free data transmission requires that at least the minimum setup and hold timing requirements are met. The present invention recognizes that to a first order, $T_{SUM}$ and $T_{HM}$ are fixed values that are substantially independent of the clock frequency. Stated differently, regardless of whether the clock frequency is low or high, $T_{SUM}$ and $T_{HM}$ must be ensured to attain error free data transmission.

A theoretical minimum clock period (T) would allow only for the required time duration $T_{SUM}+T_{HM}$. Reference is again made to the timing relationship between the clock and data signals shown in FIGS. 2A and 2B, in which $T_{HIGH}$ and $T_{LOW}$ for the clock signal, and durations $T_{SU1}$, $T_{H1}$, $T_{SU2}$, and $T_{H2}$ are shown for two bits of data, denoted BIT 1 and BIT 2. Minimizing errors during data transmission requires that magnitude of $(T_{SU1}+T_{H1})$ be substantially equal to magnitude of $(T_{SU2}+T_{H2})$. Stated differently, minimizing data transmission error requires that the duty cycle of the output clock signal be as close to 50% as possible. As described herein, the present invention receives an input clock signal whose duty cycle nominally is about 50% but in reality may lie in a range of about 33% to about 67%. The present invention then outputs a clock signal whose duty cycle is substantially 50%, e.g., a duty cycle of 50%±1% and more preferably, a duty cycle of 50%±0.1%.

When the frequency of the clock increases, the time budgeted to allow for the required $T_{SUM}+T_{HM}$, decreases. Thus, an imbalance in the clock duty cycle will necessarily impinge on the allotted time for at least one of $T_{SU}$ and $T_H$. as clock frequency increases, the requirement of a precise 50% clock signal duty cycle becomes more important in terms of reducing data transmission errors. Poor clock duty cycle can result from device mismatches within the clock generator circuitry, which typically is a phase-lock loop (PLL) configuration. Thus in practice, the CLKIN input signal for the present invention may be the output signal from a PLL circuit. (The present invention would not normally be included within the feedback path of a PLL circuit as so doing would add to phase noise associated with the PLL-generated CLKIN clock signal.)

Figure 3:
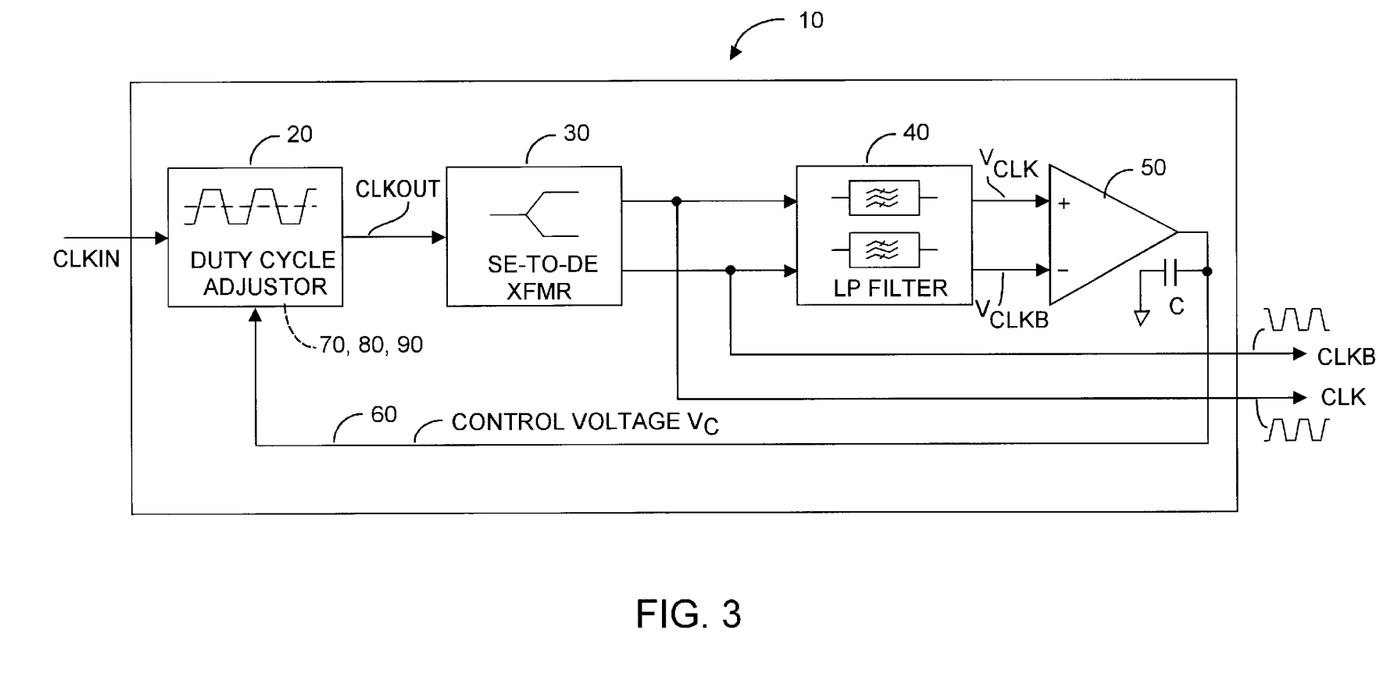
FIG. 3 depicts a clock circuit with a dynamically adjustable 50% duty cycle, according to the present invention.

The present invention reduces data transmission error by dynamically, e.g., automatically and continuously, adjusting the input clock signal waveform to establish and maintain a substantially 50% duty cycle. FIG. 3 depicts a preferred embodiment of a clock circuit 10 to dynamically attain the desired 50% duty cycle. In FIG. 3, clock circuit 10 receives an input clock signal CLKIN, whose duty cycle is nominally 50% but in practice may range from about 33% to about 67%, and outputs complementary clock signals CLK, CLKB, whose duty cycle is dynamically, i.e., continuously and automatically, adjustable to substantially 50%, according to a first embodiment of the present invention. As such, circuit 10 could be used in the prior art configuration of FIG. 1 in lieu of conventional clock circuit IC-5. In practice, the frequency range of the CLK signal output by circuit 10 could be as low as about 1 MHz to as high as perhaps 1,500 MHz. In practice, typical rise and fall times would be on the order of about 0.15 ns.

Clock circuit 10 preferably includes a duty cycle adjustor (DCA) unit 20 that receives the CLKIN signal and a feedback signal, a single-ended to differential transformer unit 30, a low pass filter unit 40, an output operational amplifier 50, and a feedback loop 60 that couples the output signal ($V_C$) from amplifier 50 to DCA unit 20, which also receives the CLKIN signal, typically a single-ended clock signal. As will be described, output signal $V_C$ is used as a control signal to vary threshold voltage $V_{TH}$ for inverters comprising DCA unit 20, and thus to vary duty cycle of the CLK (or CLKB) signal output by circuit 10.

Figure 6A:
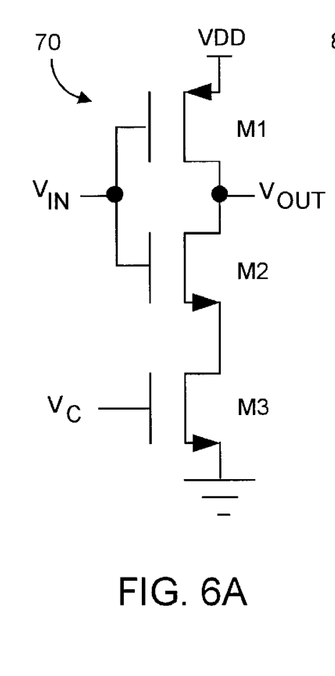
FIGS. 6A and 6B depict two embodiments of a CMOS inverter whose threshold voltage level $V_{TH}$ can be readily adjusted to alter duty cycle of an inverter output clock signal, according to the present invention.
Figure 6B:
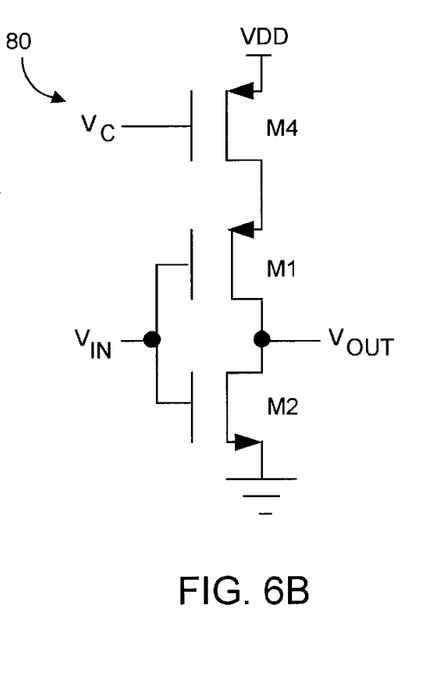

In a preferred embodiment, DCA unit 20 includes a number of series-coupled logic inverters denoted 70, 80, 90 where an odd number of inverters 90 are disposed between inverters 70 and 80. In the preferred embodiment, the threshold voltage $V_{TH}$ associated with each logic inverter 70, 80 is adjustable. Exemplary such variable threshold type inverters 70 and 80 are depicted in FIGS. 6A and 6B, described later herein. Inverter(s) 90 may be generic inverter(s) without explicit threshold adjustment capability.

Figure 4A:
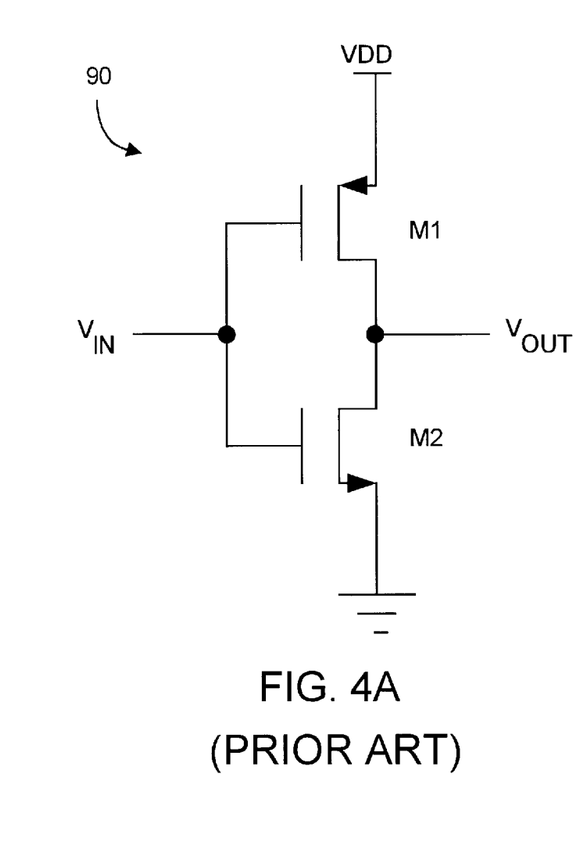
FIG. 4A depicts a generic CMOS inverter, according to the prior art.

It may be useful to first review some basic considerations of logic inverter operation, to better understand the concept of threshold variable logic inverters 70, 80 such as used in the present invention. FIG. 4A depicts a generic logic inverter 90, whose threshold voltage is not per se adjustable. Inverter 90, and indeed threshold adjustable inverters 70 and 80 may be implemented using CMOS devices such as NMOS device M1 and PMOS device M2, coupled between VDD (or other power source) and ground (or other reference). Referring still to FIG. 4A, a logic high input level for $V_{IN}$, corresponding here to a high voltage magnitude, will be inverted by inverter 90 to a logic low level, corresponding here to a low voltage magnitude $V_{OUT}$, at the inverter output and vice versa. Thus, ideally when $V_{IN}$ is high, $V_{OUT}$ is low, and when $V_{IN}$ is low, $V_{OUT}$ is high.

Figure 4B:
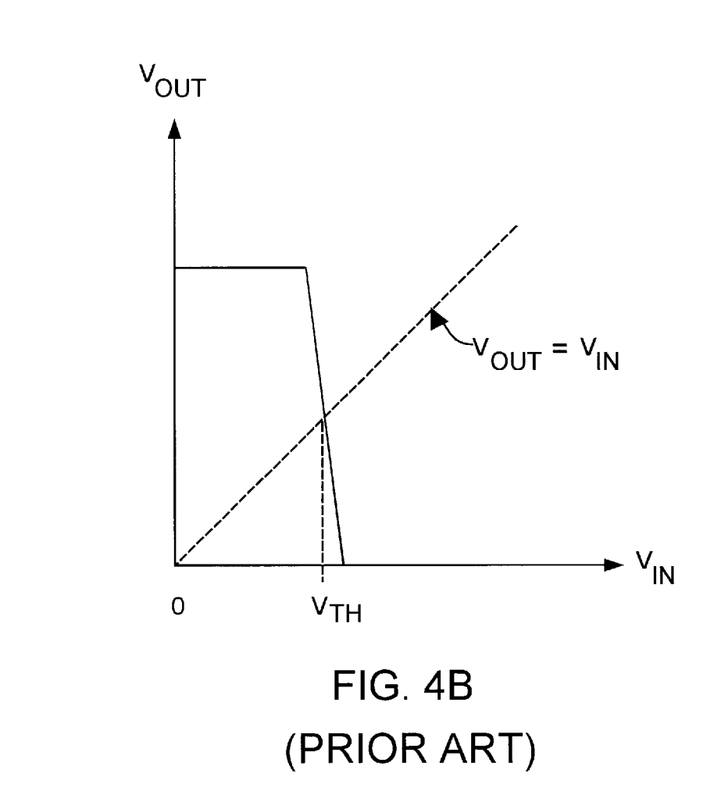
FIG. 4B depicts the $V_{IN}$ VS. $V_{OUT}$ transfer function for the CMOS inverter of FIG. 4A, according to the prior art.

FIG. 4B depicts a typical transfer function for generic inverter 90. The transition point for inverter 90 is defined when $V_{OUT}=V_{IN}$, which level is commonly referred as to the threshold level ($V_{TH}$) for the inverter. As will be described, variation in inverter threshold voltage $V_{TH}$ is created to intentionally vary duty cycle of the clock signal output by the inverter.

Figure 5A:
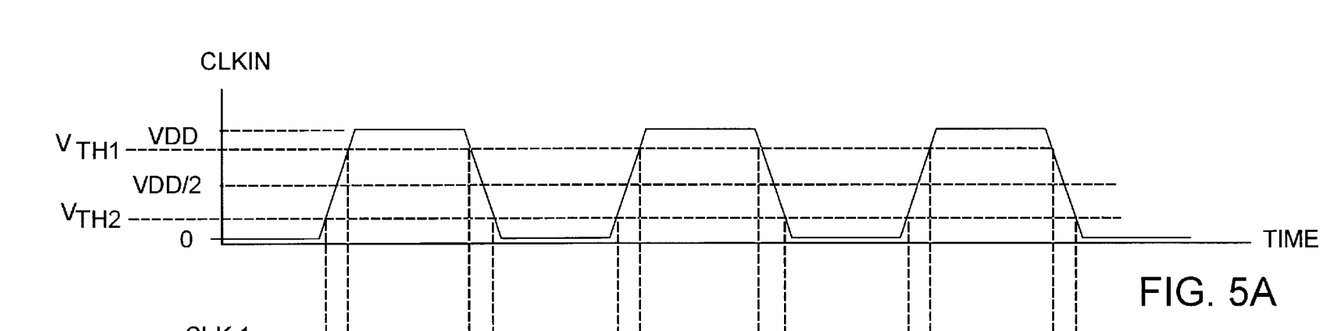
FIG. 5A depicts the CLKIN input clock having 50% duty cycle for an inverter having two inverter threshold levels $V_{TH1}$ and $V_{TH2}$, according to the present invention.

The duty cycle of the $V_{OUT}$ output signal for inverter 90 is primarily dependent upon two parameters: the duty cycle of the $V_{IN}$ signal to the inverter, and the magnitude of the inverter threshold $V_{TH}$. FIG. 5A depicts a generic input clock signal CLKIN with a nominal 50% duty cycle, and also shows two threshold voltage levels: $V_{TH1}$>VDD/2, and $V_{TH2}$<VDD/2. Assume that CLKIN is input to an inverter, perhaps inverter 90 or more preferably (as will be described with respect to FIGS. 6A and 6B, threshold variable inverters 70 or 80).

Figures 5B, 5C:
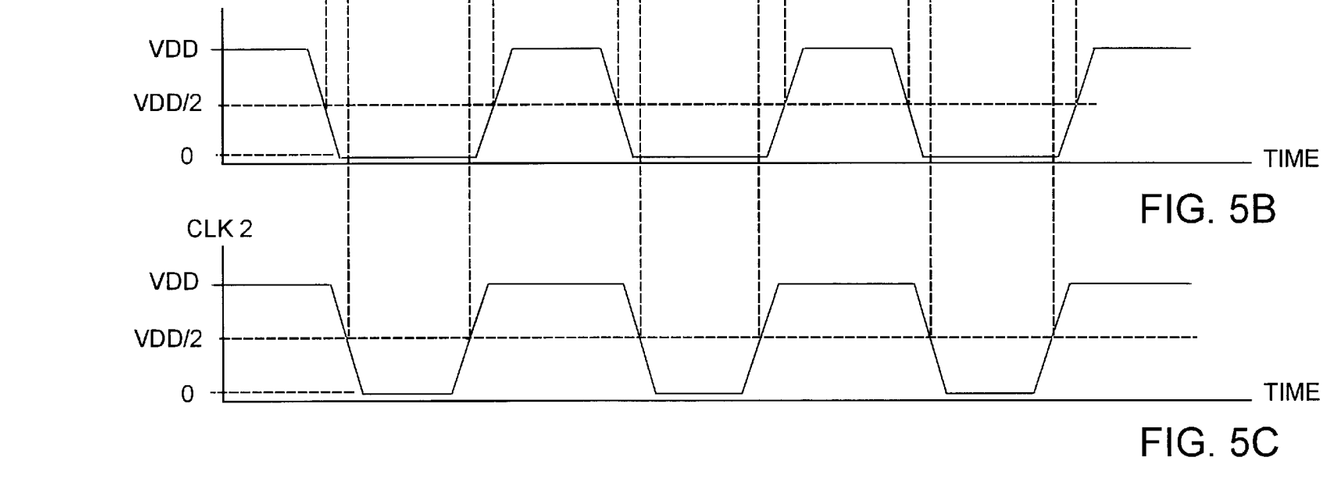
FIG. 5B depicts output signal CLK1 for an inverter having threshold $V_{TH1}$<VDD/2 and a resultant less than 50% duty cycle for CLK1, according to the present invention.
FIG. 5C depicts output signal CLK2 for an inverter having a threshold $V_{TH2}$>VDD/2, and depicts the greater than 50% duty cycle for CLK2, according to the present invention.

FIG. 5B depicts the inverter output signal, denoted CLK1, for the case where the inverter threshold voltage is $V_{TH2}$, e.g., a voltage threshold less than the magnitude of VDD/2. According to the present invention, the resultant output duty cycle for the CLK1 waveform is less than 50%, notwithstanding that the CLKIN input waveform had a nominal 50% duty cycle.

By contrast, FIG. 5C depicts the inverter output signal, denoted CLK2, for the case where the inverter threshold voltage is $V_{TH1}$, e.g., a voltage threshold greater than the magnitude of VDD/2. According to the present invention, the output duty cycle for the CLK1 waveform is greater than 50%, notwithstanding that the CLKIN input waveform had a nominal 50% duty cycle.

It will be appreciated from FIGS. 5A–5C that the duty cycle of an output clock signal, e.g., CLK (or its complement CLKB) in FIG. 3 can be dynamically adjusted by varying the threshold level $V_{TH}$ for at least one inverter stage within the DCA unit 20 in system 10 shown in FIG. 3. The duty cycle can be increased or decreased relative to 50% over a range that is determined at least in part by the rise and fall transition times of the input clock signal CLKIN.

FIGS. 6A and 6B depict two embodiments of a CMOS inverter 70, 80, whose individual threshold voltage level $V_{TH}$ can be readily adjusted by varying magnitude of a control voltage $V_C$. The desired result is a controllable variation in the duty cycle between the $V_{IN}$ signal input to the inverter, and the $V_{OUT}$ inverted signal output by the inverter.

Figure 6C:
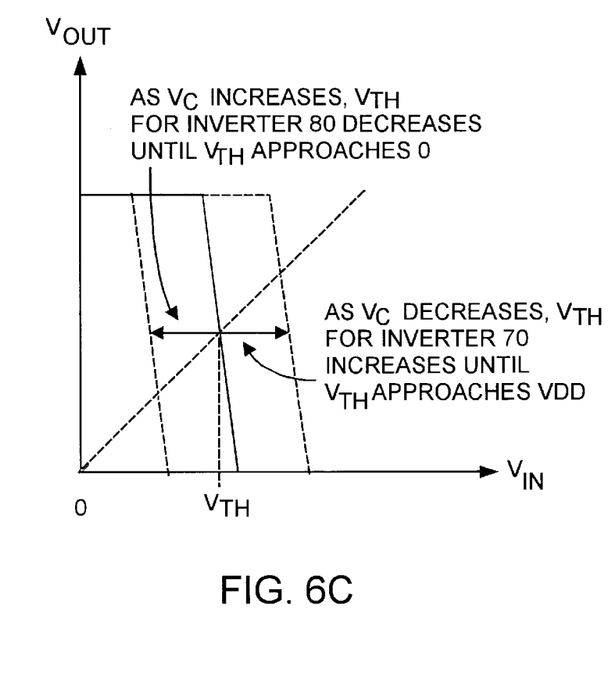
FIG. 6C depicts the transfer function for an inverter such as shown in FIGS. 6A or 6B, depicting effect of $V_C$ upon $V_{TH}$ and thus upon inverter output clock signal duty cycle, according to the present invention.

FIG. 6C depicts the transfer-function for a threshold variable inverter such as shown in FIG. 6A or FIG. 6B. FIG. 6C depicts the inter-relationship between control voltage $V_C$ and inverter threshold voltage $V_{TH}$.

More specifically, FIG. 6A depicts an inverter stage 70 comprising a CMOS inverter (devices M1, M2) coupled in series with an NMOS control device M3, whose input or gate lead is coupled to receive a control voltage $V_C$. As the magnitude of control voltage $V_C$ decreases, the threshold voltage $V_{TH}$ for inverter stage 70 will increase, until $V_{TH}$ approaches the magnitude VDD. In the embodiment of FIG. 6B, inverter stage 80 includes a PMOS device M4, whose input or gate lead is coupled to receive control voltage $V_C$. In FIG. 6B, as magnitude of $V_C$ increases, the threshold voltage $V_{TH}$ for inverter 80 decreases, until $V_{TH}$ approaches 0 VDC.

Figure 8:
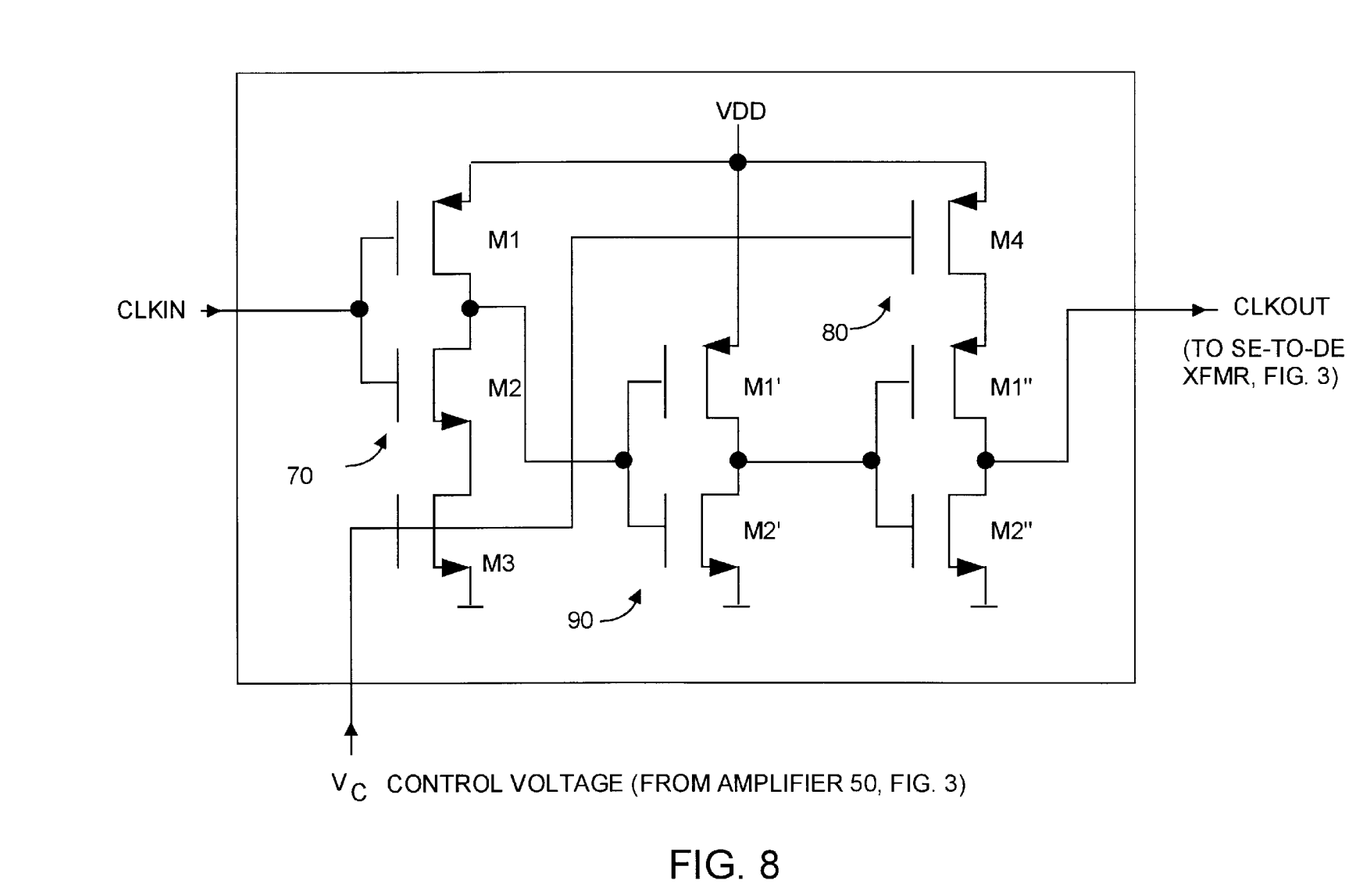
FIG. 8 depicts an exemplary duty cycle adjustor unit comprising one generic and two threshold variable logic inverters, according to the present invention.

Referring back to FIG. 3 and referring now to FIG. 8, let duty cycle adjustor unit 20 comprise an odd number (e.g., N=odd integer) of inverters 70, 80, and 90 coupled in series such that the output of one inverter is the input to the next inverter in the series. Varying the magnitude of control voltage $V_C$ advantageously results in adjusting the equivalent threshold voltage $V_{TH}$ for inverters 70 and 80, and thus of DCA unit 20, from 0 VDC to VDD, e.g., the maximum voltage range available, assuming system 10 is powered by a voltage source of magnitude VDD. Note that if inverter 70 and inverter 80 were series-coupled directly to each other, the $V_C$ variation upon $V_{TH}$ for each inverter would tend to cancel. Thus in practice, an odd number of generic inverters 90 is placed in series between the output of inverter 70 and the input of inverter 80 (or vice-versa if the roles of inverters 70 and 80 are exchanged). If desired, the total number of inverters 70, 80, 90 could be increased, although in practice a single generic inverter 90 disposed between a single inverter 70 and a single inverter 80 should suffice to implement DCA unit 20. Such a configuration of inverters within DCA unit 20 will ensure that the effects of $V_C$ upon $V_{TH}$ and thus upon output signal duty cycle will be additive or subtractive, rather than self-cancelling.

Thus in system 10 shown in FIG. 3, duty cycle adjustment unit 20 as shown in FIG. 8 will include inverter(s) such as 70, 80, and 90 to adjust output signal duty cycle up and down, e.g., greater than 50% and less than 50%. The thus-adjusted single-ended intermediate clock signal output from DCA unit 20 is preferably transformed from a single-ended signal to a pair of differential (or complementary) signals, CLK and CLKB, through the single-ended to differential transformation (SE-to-DE XFMR) unit 30. Unit 30 may be implemented using an inverter and transmission gate in combination (among other implementations).

The DC components $V_{CLK}$, $V_{CLKB}$ present in the differential clock signal CLK, CLKB output by converter unit 30 are next extracted, for example using a low-pass filter unit 40. While many filter topologies and characteristics could be used, in one embodiment low-pass filter unit had a cut-off frequency of about 10 MHz and was implemented as a single-pole filter. The DC components extracted by low pass filter unit 40 (or other unit) are input differentially to operational amplifier 50, whose output signal is coupled via feedback path 60 as a control signal ($V_C$) to DCA unit 20. Overall, the cutoff frequency of system 10 is determined primarily by amplifier 50 rather than by low pass filter unit 40. The cutoff frequency of system 10 is on the order of about 100 KHz, with a bandwidth of about 200 Hz. System 10 could, however, be implemented to exhibit different cutoff and bandwidth frequencies.

Figure 7A:
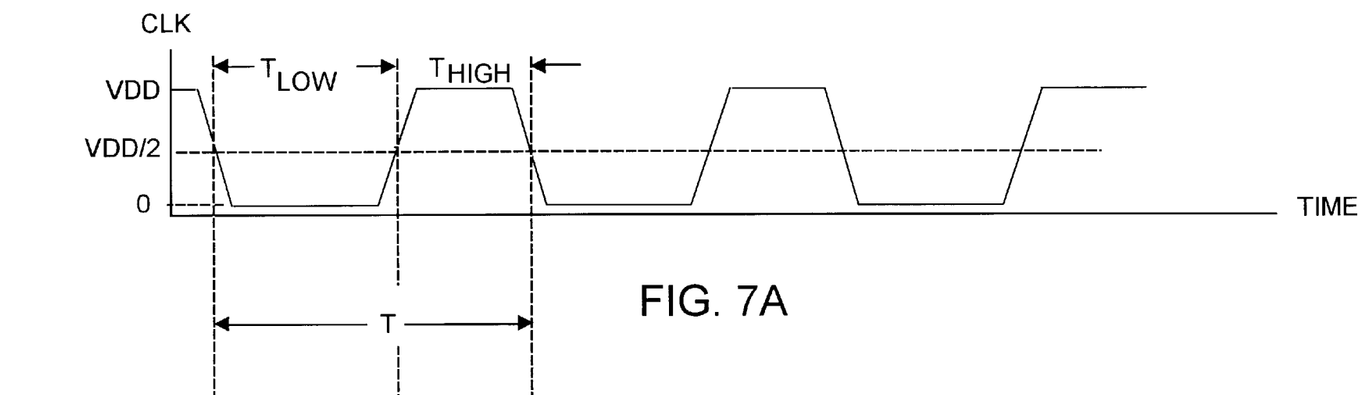
FIGS. 7A and 7B depict complementary clock waveforms CLK, CLKB as output by the single-end to differential transformer unit shown in FIG. 3, according to the present invention.
Figure 7B:
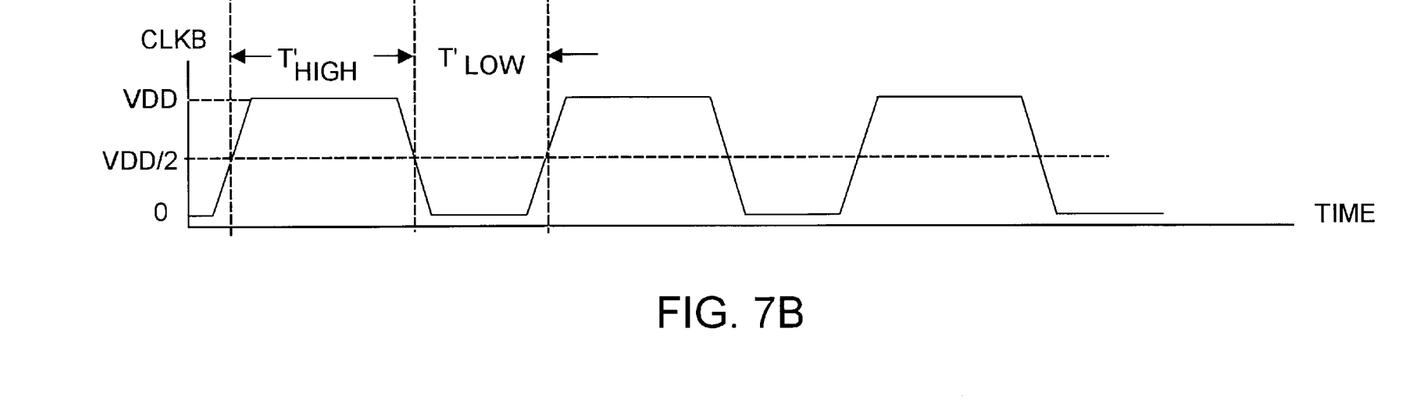

FIGS. 7A and 7B depict the complementary clock signals CLK, CLKB output by the single-ended to differential ended transformer unit 30 shown in FIG. 3. Note that the time duration of the CLK high portion of the clock cycle $T_{HIGH}$ is the same as the CLKB low portion of the clock cycle $T'_{LOW}$, and that the time duration of the CLK low portion of the clock cycle $T_{LOW}$ is the same as the CLKB high portion of the time cycle $T'_{HIGH}$. It follows from the above that the duty cycle ($D_{CLK}$) of the clock waveform CLK can be related to the duty cycle ($D_{CLKB}$) of the complementary clock waveform CLKB as follows, where T is the period of the CLK or CLKB waveform:

$$D_{CLK}=T_{HIGH}/T=T'_{LOW}/T=1-T'_{HIGH}/T=1-D_{CLKB}$$

As noted in FIG. 3, the differential clock output waveforms CLK, CLKB from unit 30 are lowpass filtered by unit 40, which extracts DC levels $V_{CLK}$, $V_{CLKB}$ from the CLK and CLKB waveforms. The DC level $V_{CLK}$ corresponding to CLK can be related to the CLK duty cycle $D_{CLK}$ as the product $V_{CLK}=VDD·D_{CLK}$, and the DC level $V_{CLKB}$ corresponding to CLKB can be related to the CLKB duty cycle $D_{CLKB}$ as the product $V_{CLKB}=VDD·D_{CLKB}$. The $V_{CLK}$, $V_{CLKB}$ DC levels are input to high gain operational amplifier 50, whose output signal is coupled via feedback path 60 as the control signal $V_C$ to duty cycle adjustor 20, as shown in FIG. 3. As described earlier herein, the effect of the $V_C$ control signal is to adjust the $V_{TH}$ thresholds of the inverter stages, e.g., 80, 90- comprising DCA unit 20, to adjust the duty cycle of the CLK, and CLKB waveforms. The frequency response of system 10 may be controlled with a capacitor (C) or the like, for example coupled to the output node of operational amplifier 50.

When system 10 is operating at steady state, the high gain of amplifier 50 and the effect of feedback loop 60 will force the $V_{CLK}$ and $V_{CLKB}$ DC input signals to be substantially equal. Advantageously, when $V_{CLK}=V_{CLKB}$, duty cycle $D_{CLK}=D_{CLKB}$. But since $D_{CLK}=1-D_{CLKB}$, it follows that $D_{CLK}=50\%$ and $D_{CLKB}=50\%$, which means duty cycle of the waveforms CLK, CLKB is 50%. Thus, the architecture exemplified by system 10 in FIG. 3 can indeed automatically and continuously act to adjust and maintain the duty cycle of an output clock signal at 50%. Typically, the tolerance of the 50% duty cycle maintained by system 10 will be on the order of at least about ±1% and in practice can be ±0.1%. Thus, it may fairly be said that the duty cycle of the CLKOUT signal output by DCA unit 20 is indeed substantially 50%, notwithstanding that the duty cycle of the CLKIN clock signal to DCA unit 20 may only be nominally 50%, e.g., about 33% to about 67%.

Modification and variations may be made to the disclosed embodiments without departing from the subject and spirit of the invention as defined by the following claims.

What is claimed is:

1. A system to receive an input clock CLKIN of nominal 50% duty cycle and to output a substantially 50% duty cycle signal CLK, the circuit comprising:

a duty cycle adjustor unit coupled to receive as input said input clock CLKIN and a control signal $V_C$, and to output said signal CLK whose duty cycle is variable as a function of magnitude of said control signal $V_C$;

means for converting said signal CLK to a differential signal pair CLK and CLKB, said means for converting coupled to receive as input said signal CLK from said duty cycle adjustor unit, and coupled to output said signal pair CLK and CLKB;

means for extracting DC components $V_{CLK}$ and $V_{CLKB}$ respectively from said signal pair CLK and CLKB, said means for extracting coupled to receive as input said signal pair CLK and CLKB and to output said DC components $V_{CLK}$ and $V_{CLKB}$;

means for comparing said DC components $V_{CLK}$ and $V_{CLKB}$ and outputting said control signal $V_C$ proportional to a difference therebetween, wherein said means for comparing receives as input said DC components $V_{CLK}$ and $V_{CLKB}$ and outputs said control signal $V_C$, said control signal $V_C$ being fedback to said duty cycle adjustor;

wherein duty cycle of said signal pair CLK and CLKB is dynamically maintained at substantially 50%.

2. The system of claim 1, wherein said duty cycle adjustor unit includes at least one logic inverter stage comprising at least one device having a parameter that is varied as a function of magnitude of said control signal $V_C$, wherein variation of said parameter alters duty cycle of a clock signal output by said logic inverter stage;

wherein said CLKIN signal is coupled as input to said logic inverter stage and said CLK signal is output by said logic inverter stage; and said control signal $V_C$ is coupled to vary duty cycle of said CLK signal output by said logic inverter stage.

3. The system of claim 1, wherein said duty cycle adjustor unit includes at least one logic inverter stage comprising an NMOS device coupled in series with a PMOS device, and further includes a MOS device coupled in series with said logic inverter stage;

wherein said CLKIN signal is coupled as input to said logic inverter stage and said CLK signal is output by said logic inverter stage; and an input lead of said MOS device is coupled to receive said control signal $V_C$ so as to vary threshold voltage $V_{TH}$ of said logic inverter stage and thus to vary duty cycle of said CLK signal output by said logic inverter stage.

4. The system of claim 3, wherein said duty cycle adjustor unit includes an odd number of logic inverter stages such that variation in magnitude of said control signal $V_C$ can controllably increase and decrease duty cycle of said CLK signal output by said logic inverter stage.

5. The system of claim 1, wherein said means for extracting includes a low pass filter unit.

6. The system of claim 1, wherein said means for comparing includes a differential input operational amplifier.

7. The system of claim 1, wherein said CLKIN signal is generated by a phase lock loop circuit.

8. The system of claim 1, wherein said input clock CLKIN has a duty cycle ranging from about 33% to about 67%.

9. The system of claim 1, wherein said CLK has a duty cycle of 50% within ±1%.

10. A method of generating a substantially 50% duty cycle signal CLK from an input clock CLKIN signal of nominal 50% duty cycle, the method the following steps:

(a) coupling said input clock CLKIN signal to a duty cycle adjustor unit that outputs said signal CLK and that varies duty cycle of said signal CLK as a function of a control signal $V_C$;

(b) converting said signal CLK output at step (a) to a differential signal pair CLK and CLKB;

(c) extracting DC components $V_{CLK}$ and $V_{CLKB}$ respectively from said signal pair CLK and CLKB converted at step (b);

(d) comparing said DC components $V_{CLK}$ and $V_{CLKB}$ extracted at step (c) and outputting said control signal $V_C$ proportional to a difference therebetween; and (e) coupling said control signal $V_C$ output at step (d) to said duty cycle adjustor unit;

wherein duty cycle of said signal pair CLK and CLKB is dynamically maintained at substantially 50%.

11. The method of claim 10, wherein step (a) includes providing at least one logic inverter stage comprising at least one device having a parameter that is varied as a function of magnitude of said control signal $V_C$, wherein variation of said parameter alters duty cycle of a clock signal output by said logic inverter stage;

wherein said CLKIN signal is coupled as input to said logic inverter stage and said CLK signal is output by said logic inverter stage; and said control signal $V_C$ is coupled to vary duty cycle of said CLK signal output by said logic inverter stage.

12. The method of claim 10, wherein step (a) includes providing at least one logic inverter stage comprising an NMOS device coupled in series with a PMOS device, and further includes a MOS device coupled in series with said logic inverter stage;

wherein said CLKIN signal is coupled as input to said logic inverter stage and said CLK signal is output by said logic inverter stage; and an input lead of said MOS device is coupled to receive said control signal $V_C$ so as to vary threshold voltage $V_{TH}$ of said logic inverter stage and thus to vary duty cycle of said CLK signal output by said logic inverter stage.

13. The method of claim 12, wherein step (a) includes providing an odd number of logic inverter stages such that variation in magnitude of said control signal $V_C$ can controllably increase and decrease duty cycle of said CLK signal output by said logic inverter stage.

14. The method of claim 10, wherein step (c) is carried out using a low pass filter unit.

15. The method of claim 10, wherein step (d) is carried out using a differential input operational amplifier.

16. The method of claim 10, wherein said input clock CLKIN has a duty cycle ranging from about 33% to about 67%.

17. The method of claim 10, wherein said CLK has a duty cycle of 50% within ±1%.

18. The method of claim 10, wherein said CLK has a duty cycle of at least 50% within ±0.5%.

19. The method of claim 10, wherein said CLK has a duty cycle of at least 50% within ±0.1%.

20. The method of claim 10, wherein:

said input clock CLKIN has a duty cycle ranging from about 33% to about 67%; and said CLK has a duty cycle of at least 50% within ±0.5%.

* * * * *

UNITED STATES PATENT AND TRADEMARK OFFICE
CERTIFICATE OF CORRECTION

PATENT NO.   : 6,670,838 B1                                     Page 1 of 1
DATED        : December 30, 2003
INVENTOR(S)  : Wangpeng Cao It is certified that error appears in the above-identified patent and that said Letters Patent is hereby corrected as shown below:

Column 2,
Line 50, change "VS." to -- vs. --

Column 3,
Line 45, before "as clock frequency" insert -- Therefore --

Column 5,
Line 20, change "transfer-function" to -- transfer function --

Column 6,
Line 35, change "$v_{CLKB}$" to -- $V_{CLKB}$ --

Column 7,
Line 1, insert a comma after "unit"
Line 65, after "method" insert -- comprising --

Signed and Sealed this

Twentieth Day of April, 2004

JON W. DUDAS
*Acting Director of the United States Patent and Trademark Office*